United States Patent
Yu et al.

(10) Patent No.: US 8,643,196 B2
(45) Date of Patent: Feb. 4, 2014

(54) STRUCTURE AND METHOD FOR BUMP TO LANDING TRACE RATIO

(75) Inventors: Chen-Hua Yu, Hsinchu (TW); Tin-Hao Kuo, Hsinchu (TW); Chen-Shien Chen, Hsinchu (TW); Mirng-Ji Lii, Sinpu Township, Hsinchu County (TW); Sheng-Yu Wu, Hsinchu (TW); Yen-Liang Lin, Taichung (TW)

(73) Assignee: Taiwan Semiconductor manufacturing Company, Ltd., Hsin-Chu (TW)

( * ) Notice: Subject to any disclaimer, the term of this patent is extended or adjusted under 35 U.S.C. 154(b) by 43 days.

(21) Appl. No.: 13/426,386

(22) Filed: Mar. 21, 2012

(65) Prior Publication Data

US 2013/0026614 A1   Jan. 31, 2013

Related U.S. Application Data

(60) Provisional application No. 61/512,283, filed on Jul. 27, 2011.

(51) Int. Cl.
*H01L 23/48* (2006.01)
*H01L 23/52* (2006.01)
*H01L 29/40* (2006.01)

(52) U.S. Cl.
USPC ............................ 257/780; 257/781; 438/613

(58) Field of Classification Search
USPC .......... 257/780, 781, 778, 784; 438/612, 613, 438/614, 666
See application file for complete search history.

(56) References Cited

U.S. PATENT DOCUMENTS

| | | | |
|---|---|---|---|
| 5,923,955 A | 7/1999 | Wong | |
| 6,340,608 B1 | 1/2002 | Chooi et al. | |
| 7,468,316 B2 | 12/2008 | Lee et al. | |
| 7,476,564 B2 | 1/2009 | Chen et al. | |
| 8,338,967 B2* | 12/2012 | Hochstenbach | 257/780 |
| 2003/0173681 A1* | 9/2003 | Bendal | 257/780 |
| 2003/0189261 A1* | 10/2003 | Tong et al. | 257/780 |
| 2006/0012055 A1* | 1/2006 | Foong et al. | 257/780 |
| 2006/0223313 A1 | 10/2006 | Yoon et al. | |
| 2007/0001277 A1 | 1/2007 | Ichikawa | |
| 2007/0045869 A1* | 3/2007 | Ho et al. | 257/780 |
| 2007/0114674 A1* | 5/2007 | Brown | 257/780 |
| 2009/0146303 A1 | 6/2009 | Kwon | |

OTHER PUBLICATIONS

Author Unknown, "The Thermal Copper Pillar Bump: Enabling Improved Semiconductor Performance Without Sacrificing Efficiency," Nextreme Thermal Solutions, Jan. 9, 2008, 12 pages.
Author Unknown, "Reliability of uPILR Fine-Pitch Flip-Chip Packages," presented at 59th Electronic Components and Technology Conference (ECTC), San Diego, CA, May 27, 2009, 19 pages.

(Continued)

Primary Examiner — S. V. Clark
(74) Attorney, Agent, or Firm — Haynes and Boone, LLP

(57) ABSTRACT

The present disclosure provides an integrated circuit. The integrated circuit includes an interconnect structure formed on a substrate; a landing metal trace formed on the interconnect structure and coupled to the interconnect structure, wherein the landing metal trace includes a first width T defined in a first direction; and a metal bump post formed on and aligned with the landing metal trace, wherein the metal bump post includes a second width U defined in the first direction, and the second width U is greater than the first width T.

20 Claims, 3 Drawing Sheets

(56) References Cited

OTHER PUBLICATIONS

Patel, Neha M., et al, "Flip-Chip Packaging Technology for Enabling 45nm Products," Intel Technology Journal, vol. 12, Issue 2, Jun. 17, 2008, ISSN 1535-864X, p. 145-157.

Banijamali, Bahareh, et al., "Reliability of Fine-Pitch Flip-Chip Packages," May 2009, Electronic Components and Technology Conference, p. 293-300.

Mohammed, Ilyas, et al., "Crack Growth-resistant Interconnects for High-Reliability Microelectronics," Jun. 24, 2008, 2008 Electronic Components and Technology Conference, p. 1880-1886.

Witvrouw, Ann, "CMOS-MEMS Integration: Why, How and What?" ?, ICCAD '06, Nov. 5-9, 2006, San Jose, CA, p. 826-827.

U.S. Patent Office, unpublished U.S. Appl. No. 13/195,243, filed Aug. 1, 2011, "Electrical Bypass Structure for MEMS Device," 59 pgs.

\* cited by examiner

STRUCTURE AND METHOD FOR BUMP TO LANDING TRACE RATIO

This application claims the benefit of U.S. Provisional Patent Application Ser. No. 61/512,283 entitled "Structure and Method For Bump To Landing Trace Ratio," filed Jul. 27, 2011, herein incorporated by reference in its entirety.

BACKGROUND

In advanced integrated circuit technology, device dimensions are scaled down. Various factors degrade the performance of the integrated circuit. The electro-migration (EM) issue is impacted by the structure and dimensions of under bump metal (UBM) in the backend of line. On the other side, changing the structure and dimensions of the UBM intended to improve EM performance may cause other issue, such as bump to bride bridging. The bump fatigue performance is degraded. Therefore, a structure of an UBM and the method making the same are needed to address the above issue.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figures 1, 2:
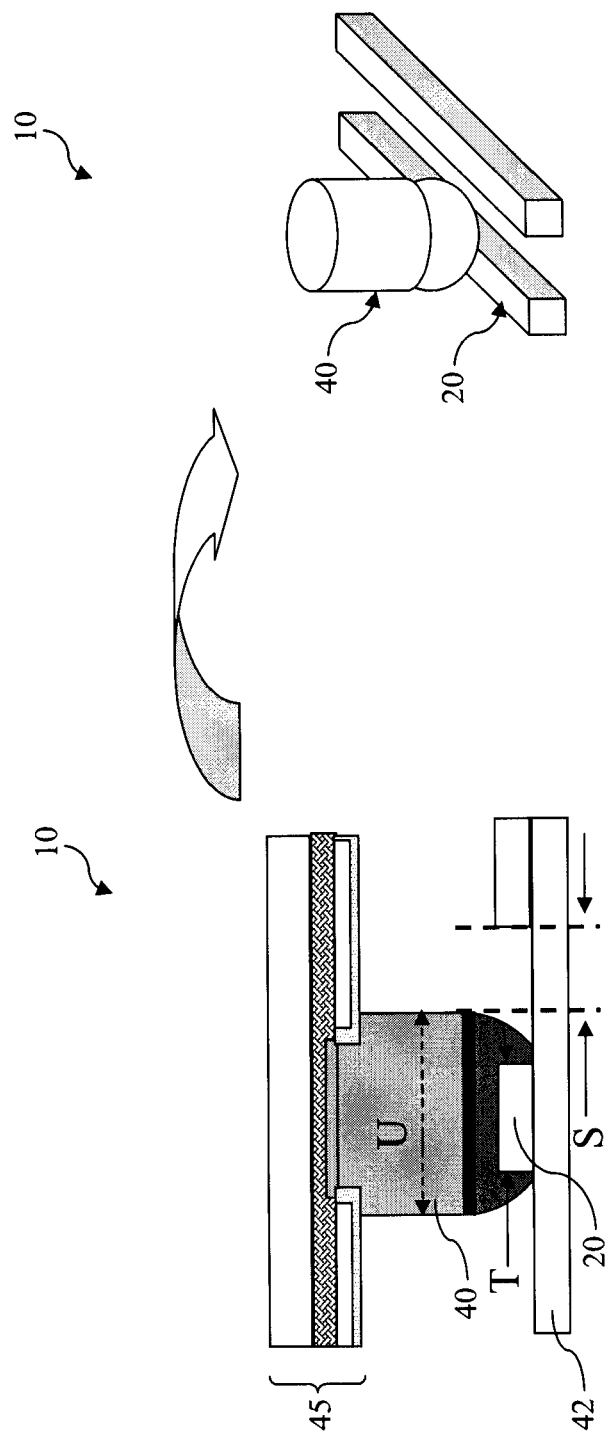
FIG. 1 illustrates a sectional view of a bonding structure of an integrated circuit constructed according to various aspects of the present disclosure in one or more embodiments.
FIG. 2 illustrates a perspective view of the integrated circuit of FIG. 1 according one or more embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 illustrates a sectional view of a bonding structure of an integrated circuit 10 constructed according to various aspects of the present disclosure in one or more embodiments. FIG. 2 illustrates a perspective view of the integrated circuit 10 according one or more embodiments. The integrated circuit 10 and the method of making the same are collectively described with reference to FIGS. 1 and 2.

The integrated circuit 10 is formed on a semiconductor substrate (not shown), such as a silicon substrate. Alternatively or additionally, the substrate includes germanium, silicon germanium or other proper semiconductor materials. The semiconductor substrate may also include various isolation features, such as shallow trench isolation (STI), formed in the substrate to separate various devices. The semiconductor substrate also includes various doped regions such as n-well and p-wells.

The integrate circuit 10 further include various devices, such as transistors, diodes, resistors, capacitors, sensors, memory cells or other suitable IC devices. In one example, the integrated circuit 10 includes field effect transistor having source and drain features formed in the semiconductor substrate and further includes a gate stack formed on the semiconductor substrate and disposed between the source and drain features configured to form a functional transistor.

The integrated circuit 10 also include an interconnect structure having various metal layers. The interconnect structure includes metal lines formed in the metal layers and contact features and via features. The contact features connect the doped features and/or gate electrodes to respective metal lines and the via features connect metal lines in neighboring metal layers. The interconnect structure is configured to couple the various doped features and conductive features to form various devices, resulting in one or more functional circuits integrated on the semiconductor substrate.

Particularly, the integrated circuit 10 includes various bonding structures to couple the various IC devices to the packaging (or packaging substrate) and further to the input/output signals and power sources. In one example, features 42 is a portion of the substrate with devices and the interconnect structure and the features 45 is a portion of the packaging substrate.

FIG. 1 only shows one bonding structure for simplicity. The bonding structure includes a landing metal trace 20 properly coupled to the interconnect structure and further includes a metal bump post (or metal post) 40 aligned with and overlying the landing metal trace 20. In one embodiment, various conductive features may be disposed between the landing metal trace 20 and the metal bump post 40. In this embodiment, a ratio T/U is below 0.6.

Figure 4:
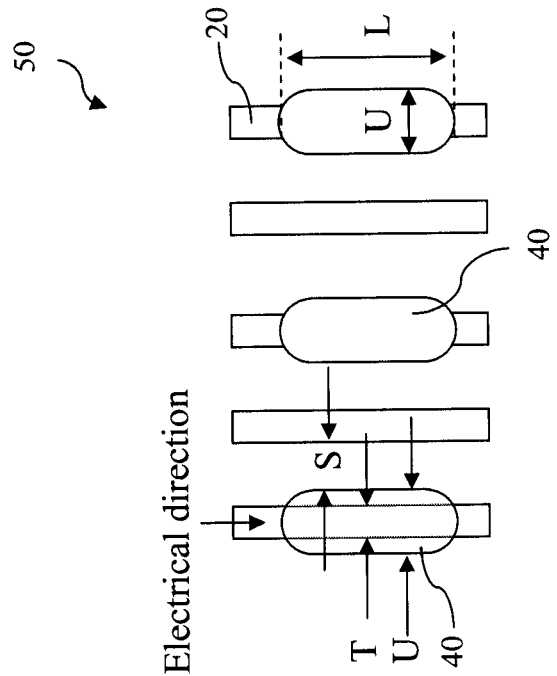
FIG. 4 illustrates a top view of the integrated circuit of FIG. 3 according one or more embodiments.
Figure 3:
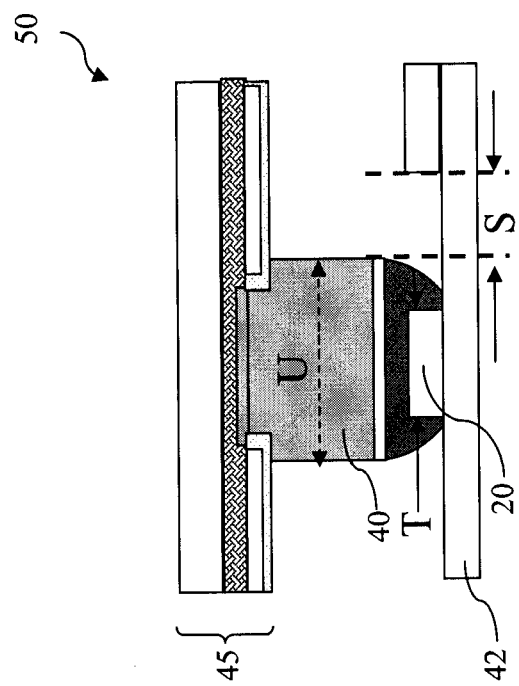
FIG. 3 illustrates a sectional view of a bonding structure of an integrated circuit constructed according to various aspects of the present disclosure in one or more embodiments.

FIG. 3 illustrates a sectional view of a bonding structure of an integrated circuit 50 constructed according to various aspects of the present disclosure in one or more embodiments. FIG. 4 illustrates a top view of the integrated circuit 50 according one or more embodiments. The integrated circuit 50 and the method of making the same are collectively described with reference to FIGS. 3 and 4. The integrated circuit 50 is also formed on a substrate, such as a semiconductor substrate. The integrated circuit 50 also includes various devices and an interconnect structure.

The integrated circuit 50 includes various bonding structures to couple the various IC devices to the packaging and further to the input/output signals and power sources. FIG. 3 only illustrates one bonding structure for simplicity. The bonding structure includes a landing metal trace 20 properly coupled to the interconnect structure and further includes a metal bump post 40 aligned with, overlying and coupled with the landing metal trace 20. In one example, the metal bump post 40 includes copper formed by sputtering, plating or combination.

The landing metal trace 20 defines a width labeled as "T" in FIG. 4. The width T is defined and spanned in a direction perpendicular to the direction of an electrical current through the landing metal trace 20. The metal bump post 40 defines a width labeled as "U" and a length labeled as "L" in FIG. 4. The width U is defined as a dimension perpendicular to the landing metal trace routing direction. A space "S" is defined between a metal bump post and a proximate landing metal trace, as illustrated in FIGS. 3 and 4. The length L is defined to be spanned in a first direction of the electrical current. The widths U and T are defined to be spanned in a second direction perpendicular to the first direction. Particularly, according to the present embodiment, the width U of the metal bump post 20 is greater than the width T of the landing metal trace 20.

In furtherance of the embodiment, the ratio L/U is less than 2 as L/U<2. The ratio T/U ranges as 0.5=<T/U<1. Alternatively, the ratio T/U ranges as 0.7=<T/U<0.9, or 0.75=<T/U<0.85. The ratio S/T ranges as S/T<0.6. Alternatively, the ratio S/T ranges as S/T<0.5, or S/T<0.4. The ratio U/S ranges as 2<U/S<4. Alternatively, the ratio U/S ranges as 2.5<U/S<3.5.

The design consideration to the disclosure structure is based on the issues identified in the present disclosure. One issue the bridge risk that may occur at the interface between the landing metal trace 20 and the metal bump post 40. Another issue the electro-migration (EM). In the design consideration, the mean time between failures (MTTF) is determined by an equation formulated as MTTF=A(1/f")xexp(Q/kT). The integrated circuit 50 effectively eliminates or reduces the bridge risk. The integrated circuit 50 further reduces the EM issue and enhances the circuit performance.

Figure 5:
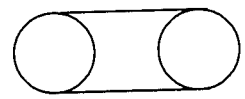
FIG. 5 illustrates perspective views of the metal bump post according to various embodiments.
Figure 5:
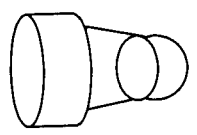
Figure 5:
Figure 5:
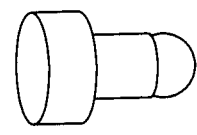
Figure 5:
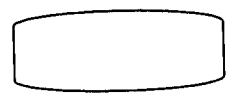

FIG. 5 illustrates perspective views of metal bump post 40 that may be incorporated in the integrated circuit 50 of FIGS. 3 and 4 according to various embodiments. The metal bump post 40 may have column shape, conical shape or other suitable shape, such as those shapes illustrated in FIG. 5.

Figure 6:
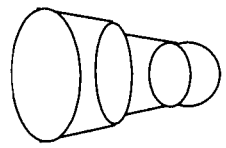
FIG. 6 illustrates top views of the metal bump post according to various embodiments.
Figure 6:
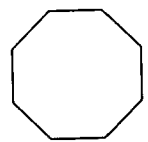
Figure 6:
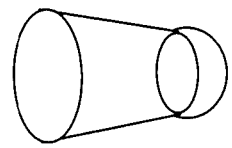
Figure 6:
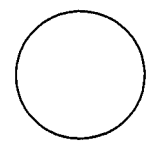

FIG. 6 illustrates top views of the metal bump post 40 that may be incorporated in the integrated circuit 50 of FIGS. 3 and 4 according to various embodiments. The metal bump post 40 may have different geometries, such as round, polygon, elongated shape, oval shape or other suitable shape illustrated in FIG. 6.

Although embodiments of the present disclosure have been described in detail, those skilled in the art should understand that they may make various changes, substitutions and alterations herein without departing from the spirit and scope of the present disclosure. For example, the present disclosure is not limited to a particular application. In one example, the integrated circuit 50 may include various IC structure, such as a field effect transistor, a dynamic random access second (DRAM) cell, field programmable gate-array (FPGA) and/or other microelectronic devices. Of course, aspects of the present disclosure may be employed in many different applications, including sensor cells, logic cells, and others.

Thus, the present disclosure provides one embodiment of an integrated circuit. The integrated circuit includes an interconnect structure formed on a substrate; a landing metal trace formed on the interconnect structure and coupled to the interconnect structure, wherein the landing metal trace includes a first width T defined in a first direction; and a metal bump post formed on and aligned with the landing metal trace, wherein the metal bump post includes a second width U defined in the first direction, and the second width U is greater than the first width T.

In one embodiment of the integrated circuit, the first width T and the second width U define a first ratio T/U greater or equal to 0.5 and less than 1. In another embodiment, the first ratio T/U is greater or equal to 0.7 and less than 0.9. In yet another embodiment, the first ratio T/U is greater or equal to 0.75 and less than 0.85.

In another embodiment, the metal bump post includes a length defined in a second direction perpendicular to the first direction, a second ratio L/U is less than 2.

In yet another embodiment, the integrated circuit further includes a neighboring landing metal trace approximate to the landing metal trace, wherein a space S is defined as a distance between the metal bump post and the neighboring landing metal trace, and a third ratio S/T is less than 0.6.

In yet another embodiment, the third ratio S/T is less than 0.5. In yet another embodiment, the third ratio S/T is less than 0.4. In yet another embodiment, a fourth ratio U/S is greater than 2 and less than 4. In yet another embodiment, the fourth ratio U/S is greater than 2.5 and less than 3.5.

In yet another embodiment, the metal bump post includes copper. In yet another embodiment, the first direction is perpendicular to a direction of electrical current through the landing metal trace.

In yet another embodiment, the metal bump post includes a shape from one of column shape and conical shape.

In yet another embodiment, the metal bump post includes a shape, in top view, selected from the group consisting of round, polygon, elongated shape and oval shape.

The present disclosure also provides one embodiment of a method. The method includes forming an interconnect structure on a substrate; forming a landing metal trace on the interconnect structure, wherein the landing metal trace includes a first width T defined in a first direction; and forming a metal bump post on the landing metal trace, wherein the metal bump post includes a second width U defined in the first direction, and the second width U is greater than the first width T.

In one embodiment of the method, the forming of the metal bump post includes forming a copper post by at least one of deposition and plating.

In another embodiment, the method further includes forming various integrated circuit devices on the substrate.

In yet another embodiment, the forming of the metal bump post includes forming the metal bump post with a first ratio T/U greater or equal to 0.5 and less than 1.

In yet another embodiment, the forming of metal bump post includes forming the metal bump post with a shape selected from one of column shape and conical shape.

In yet another embodiment, the forming of the metal bump post includes forming the metal bump post with a shape, in top view, selected from the group consisting of round, polygon, elongated shape and oval shape.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit, comprising:
   an interconnect structure formed on a substrate;
   a landing metal trace formed on the interconnect structure and coupled to the interconnect structure, wherein the landing metal trace includes a first width T defined in a first direction; and a metal bump post formed on and aligned with the landing metal trace, wherein the metal bump post includes a second width U defined in the first direction, and the second width U is greater than the first width T, and wherein the first width T and the second width U define a ratio T/U greater or equal to 0.5 and less than 1.

2. The integrated circuit of claim 1, wherein the ratio T/U is greater or equal to 0.7 and less than 0.9.

3. The integrated circuit of claim 1, wherein the ratio T/U is greater or equal to 0.75 and less than 0.85.

4. An integrated circuit, comprising:
an interconnect structure formed on a substrate;
a landing metal trace formed on the interconnect structure and coupled to the interconnect structure, wherein the landing metal trace includes a first width T defined in a first direction; and
a metal bump post formed on and aligned with the landing metal trace, wherein the metal bump post includes a second width U defined in the first direction, and the second width U is greater than the first width T, wherein the metal bump post includes a length defined in a second direction perpendicular to the first direction, and a ratio L/U is less than 2.

5. The integrated circuit of claim 1, further including a neighboring landing metal trace approximate to the landing metal trace, wherein
a space S is defined as a distance between the metal bump post and the neighboring landing metal trace, and
a ratio S/T is less than 0.6.

6. The integrated circuit of claim 5, wherein the ratio S/T is less than 0.5.

7. The integrated circuit of claim 5, wherein the ratio S/T is less than 0.4.

8. The integrated circuit of claim 5, wherein a ratio U/S is greater than 2 and less than 4.

9. The integrated circuit of claim 5, wherein a ratio U/S is greater than 2.5 and less than 3.5.

10. The integrated circuit of claim 1, wherein the metal bump post includes copper.

11. The integrated circuit of claim 1, wherein the first direction is perpendicular to a direction of electrical current through the landing metal trace.

12. The integrated circuit of claim 1, wherein the metal bump post includes a shape from one of column shape and conical shape.

13. The integrated circuit of claim 1, wherein the metal bump post includes a shape, of top view, selected from a group consisting of round, polygon, elongated shape, and oval shape.

14. A method, comprising:
forming an interconnect structure on a substrate;
forming a landing metal trace on the interconnect structure, wherein the landing metal trace includes a first width T defined in a first direction; and
forming a metal bump post on the landing metal trace, wherein the metal bump post includes a second width U defined in the first direction, and the second width U is greater than the first width T, wherein the forming of the metal bump post includes forming the metal bump post with a ratio T/U greater or equal to 0.5 and less than 1.

15. The method of claim 14, wherein the forming of the metal bump post includes forming a copper post by at least one of deposition and plating.

16. The method of claim 14, further comprising forming various integrated circuit devices on the substrate.

17. The method of claim 14, wherein the forming of the metal bump post includes forming the metal bump post with a shape selected from one of column shape and conical shape.

18. The integrated circuit method of claim 14, wherein the forming of the metal bump post includes forming the metal bump post with a shape, in top view, selected from 1 group consisting of round, polygon, elongated shape, and oval shape.

19. The method of claim 14, wherein the metal bump post includes a length L defined in a second direction perpendicular to the first direction, and a ratio L/U is less than 2.

20. The integrated circuit of claim 4, further including a neighboring landing metal trace approximate to the landing metal trace, wherein
a space S is defined as a distance between the metal bump post and the neighboring landing metal trace, and
a ratio S/T is less than 0.6.

* * * * *